United States Patent
McEwen et al.

(10) Patent No.: US 10,331,837 B1
(45) Date of Patent: Jun. 25, 2019

(54) DEVICE GRAPHICS RENDERING FOR ELECTRONIC DESIGNS

(71) Applicant: Xilinx, Inc., San Jose, CA (US)

(72) Inventors: Jennifer D. McEwen, Boulder, CO (US); Ian L. McEwen, Boulder, CO (US); Chong M. Lee, Broomfield, CO (US); Bart Reynolds, Manzanita, OR (US)

(73) Assignee: XILINX, INC., San Jose, CA (US)

( * ) Notice: Subject to any disclaimer, the term of this patent is extended or adjusted under 35 U.S.C. 154(b) by 240 days.

(21) Appl. No.: 15/354,894

(22) Filed: Nov. 17, 2016

(51) Int. Cl.
*G06F 17/50* (2006.01)
*G06T 11/20* (2006.01)
*G06T 11/60* (2006.01)

(52) U.S. Cl.
CPC ...... *G06F 17/5072* (2013.01); *G06F 17/5081* (2013.01); *G06T 11/20* (2013.01); *G06T 11/60* (2013.01); *G06T 2207/20021* (2013.01); *G06T 2207/30148* (2013.01)

(58) Field of Classification Search
CPC .. G06F 17/5072; G06F 17/5081; G06T 11/20; G06T 11/60; G06T 2207/30148; G06T 2207/20021
See application file for complete search history.

(56) References Cited

U.S. PATENT DOCUMENTS

2014/0097869 A1* 4/2014 Ngai ............. H03K 19/017581
326/41

* cited by examiner

*Primary Examiner* — Vuthe Siek
(74) *Attorney, Agent, or Firm* — Kevin T. Cuenot

(57) ABSTRACT

Rendering a graphical representation of an integrated circuit can include determining, using a processor, a tile of a device model at least partially within a viewport, determining, using the processor, an owning tile having a fly-over wire passing over the tile, determining, using the processor, a predetermined shape of the fly-over wire, and drawing, using the processor, the fly-over wire within the viewport based upon the shape.

18 Claims, 10 Drawing Sheets

| Tile A | |
|---|---|
| Wire ID | Shape ID |
| 0 | x |
| 1 | x |
| 2 | 34 |
| 3 | x |
| 4 | x |
| 5 | 78 |
| 6 | x |

| Tile B | |
|---|---|
| Wire ID | Shape ID |
| 0 | x |
| 1 | x |
| 2 | 56 |
| 3 | 24 |
| 4 | x |
| 5 | 13 |
| 6 | x |

| Tile C | |
|---|---|
| Wire ID | Shape ID |
| 0 | x |
| 1 | x |
| 2 | x |
| 3 | 120 |
| 4 | x |
| 5 | 14 |
| 6 | x |

| Tile D | |
|---|---|
| Wire ID | Shape ID |
| 0 | x |
| 1 | x |
| 2 | 34 |
| 3 | x |
| 4 | x |
| 5 | 78 |
| 6 | x |

| Tile E | |
|---|---|
| Wire ID | Shape ID |
| 0 | x |
| 1 | x |
| 2 | 56 |
| 3 | 24 |
| 4 | x |
| 5 | 13 |
| 6 | x |

FIG. 6

| GTP 0 | |
|---|---|
| Wire ID | Shape ID |
| 0 | x |
| 1 | x |
| 2 | 34 |
| 3 | x |
| 4 | x |
| 5 | 78 |
| 6 | x |

| GTP 1 | |
|---|---|
| Wire ID | Shape ID |
| 0 | x |
| 1 | x |
| 2 | 56 |
| 3 | 24 |
| 4 | x |
| 5 | 13 |
| 6 | x |

| GTP 2 | |
|---|---|
| Wire ID | Shape ID |
| 0 | x |
| 1 | x |
| 2 | x |
| 3 | 120 |
| 4 | x |
| 5 | 14 |
| 6 | x |

FIG. 7

| GTP 0 | | GTP 1 | | GTP 2 | |
|---|---|---|---|---|---|
| Wire ID | Shape ID | Wire ID | Shape ID | Wire ID | Shape ID |
| 0 | x | 0 | x | 0 | x |
| 1 | x | 1 | x | 1 | x |
| 2 | 34 | 2 | 56 | 2 | x |
| 3 | x | 3 | 24 | 3 | 120 |
| 4 | x | 4 | x | 4 | x |
| 5 | 78 | 5 | 13 | 5 | 14 |
| 6 | x | 6 | x | 6 | x |

800

| Index | Wire ID |
|---|---|
| 0 | 2 |
| 1 | 3 |
| 2 | 5 |

FIG. 8

| GTP 0 | | GTP 1 | | GTP 2 | |
|---|---|---|---|---|---|
| Index | Shape ID | Index | Shape ID | Index | Shape ID |
| 0 | 34 | 0 | 56 | 0 | x |
| 1 | x | 2 | 24 | 1 | 120 |
| 2 | 78 | 1 | 13 | 2 | 14 |

FIG. 9

DEVICE GRAPHICS RENDERING FOR ELECTRONIC DESIGNS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to electronic design automation tools for integrated circuits (ICs) and, more particularly, to rendering a graphical representation of an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable circuit blocks called "tiles." These tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

In general, the elements within tiles are connected using wires of various lengths. Some wires connect a source located within a tile to a load located within the same tile. Other wires connect elements in different tiles. For example, the wire may connect a source located within a first tile with a load located within an adjacent or abutting tile. Still other wires connect a source located within a tile to a load located in a non-adjacent or non-abutting tile. For example, the wire may connect a source located in a first tile to a load located in a second tile, where the first and second tiles are separated by one or more intervening tiles.

Within the actual IC, wires exist in metal or conductive layers typically located above the layers of the IC used to form elements such as transistors, memory cells, and so forth. Wires that connect a source and a load in non-adjacent tiles travel over the intervening tile(s). These wires merely pass over the intervening tiles and have no interaction with the circuitry within these intervening tiles.

Electronic design automation (EDA) tools routinely render graphical representations of ICs. In many cases, the EDA tool generates a flat, e.g., 2-dimensional (2D), representation of the 3D IC structure. In general, elements of the physical IC are represented as objects within a data structure referred to as a device model of the IC. In the usual case, the EDA tool generates the 2D representation from the device model. For purposes of generating graphical representations of the IC, EDA tools have treated wires as belonging to the particular tile over which that wire is located or passes. This technique is sometimes used for programmable ICs such as FPGAs due to the tile array architecture of the programmable ICs.

As programmable ICs become larger and exhibit more diverse layouts, the ability to generate a device model from hardware description language and render a graphical representation of the device model become ever more useful. Unfortunately, generating a graphical representation of the device model of an IC becomes increasingly difficult as storage of the device model and the rendering operations require ever more resources of the EDA tool, thereby degrading performance.

SUMMARY

An embodiment includes a method of rendering a graphical representation of an integrated circuit (IC). The method can include determining, using a processor, a tile of a device model at least partially within a viewport, determining, using the processor, an owning tile having a fly-over wire passing over the tile, determining, using the processor, a predetermined shape of the fly-over wire, and drawing, using the processor, the fly-over wire within the viewport based upon the shape.

Another embodiment includes a system for rendering a graphical representation of an IC. The system includes a processor programmed to initiate executable operations. The executable operations can include determining a tile of a device model at least partially within a viewport, determining an owning tile having a fly-over wire passing over the tile, determining a predetermined shape of the fly-over wire, and drawing, on a display device, the fly-over wire within the viewport based upon the shape.

Another embodiment includes a computer program product. The computer program product includes a computer readable storage medium having program code stored thereon for rendering a graphical representation of an IC. The program code is executable by a processor to perform operations including determining a tile of a device model at least partially within a viewport, determining an owning tile having a fly-over wire passing over the tile, determining a predetermined shape of the fly-over wire, and drawing the fly-over wire within the viewport based upon the shape.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIGS. 3-1 and 3-2, taken collectively, illustrate an example of rendering fly-over wires using shapes of a graphical model.

FIG. 6 illustrates example graphical tile patterns for instances of a particular type of tile.

FIG. 7 illustrates an example set of unique graphical tile patterns for a particular type of tile.

FIGS. 8 and 9, taken collectively, illustrate an example of compressing the graphical tile patterns.

DETAILED DESCRIPTION

Figure 1:
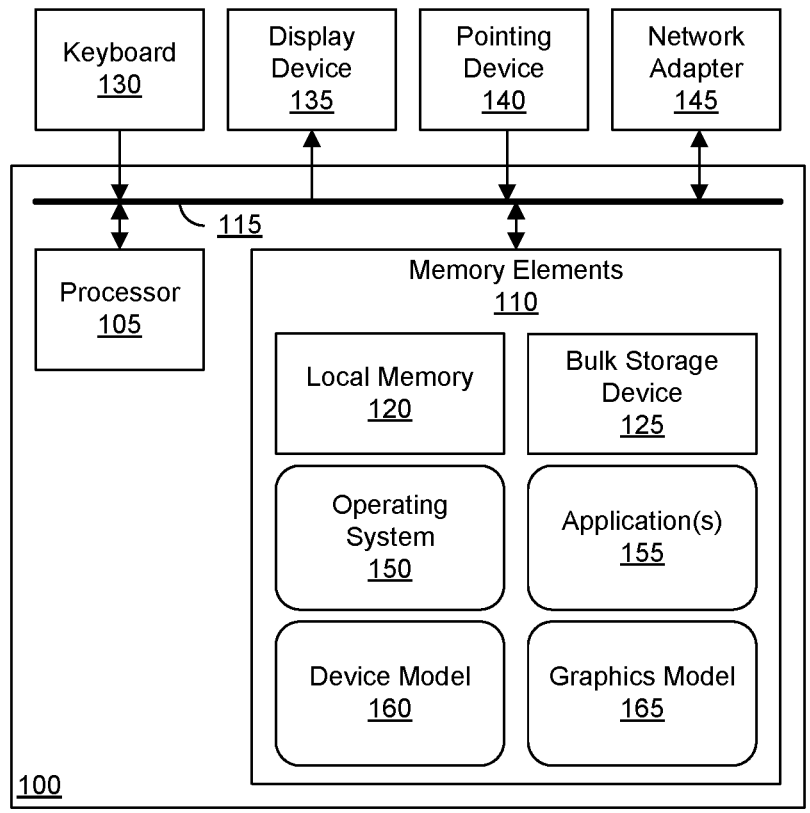
FIG. 1 illustrates an example data processing system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to electronic design automation (EDA) tools for integrated circuits (ICs) and, more particularly, to rendering a graphical representation of an IC. One or more embodiments described within this disclosure relate to computer graphics and the rendering of graphical representations of fly-over wires of an IC. In one aspect, fly-over wires are represented as shapes specified as part of a graphics model. The fly-over wires are rendered using the shapes, but do not have corresponding objects within a device model of the IC. Further, the fly-over wires are considered to belong, or be owned by, a single tile. Thus, one tile owns the fly-over wire as opposed to spreading ownership of segments of the fly-over wire among the various tiles over which the fly-over wire passes.

In one embodiment, tiles of a same type that own fly-over wires may be grouped according to graphical tile patterns of the respective tiles. A graphical tile pattern is a data structure that generally describes the fly-over wires of a tile and the shapes of the fly-over wires. The amount of memory needed for storing the graphical tile patterns is reduced compared to other techniques for storing representations of fly-over wires. Since the fly-over wires are not represented by corresponding objects in the device model, the size and/or complexity of the device model is reduced, thereby reducing memory requirements and/or improving runtime performance of the EDA tool.

When rendering a graphical representation of the IC, or a portion thereof, the tile(s) or portions of tiles of the IC within a viewport may be determined. The owning tile(s) of the fly-over wire(s) that pass over the tile(s) within the viewport may also be determined. In general, the fly-over wires that pass over the tile(s) within the viewport may be rendered on a display screen of the EDA tool based, at least in part, upon the graphical tile pattern for each of the owning tile(s). In this regard, the information needed to render the fly-over wire(s) within the viewport is stored in association with the owning tile of the fly-over wire(s) as opposed to being segmented and stored with each of the individual tiles over which the fly-over wire(s) pass. In one embodiment, the information needed to render the fly-over wires is stored independently of the tile data structures. This organization and the supporting data structures require less memory for storage and facilitate improved runtime performance.

As generally known within the field of computer graphics, a "viewport" is the user's viewable area of content on a display screen. In the examples provided within this disclosure, the viewport includes the IC that is viewable by the user or the portion of the IC that is viewable by the user depending upon the level of zoom in effect at any given time. Often, the graphical representation of the IC that is rendered is based upon the device model of the IC. Portions of the IC, or the device model of the IC, that fall outside of the viewport are not rendered on the display screen. A viewport is typically a rectangular region in computer graphics.

The inventive arrangements described herein may be implemented as a method or process performed by a data processing system for rendering a graphical representation of an IC. In another aspect, the inventive arrangements may be implemented as a data processing system having a processor. The processor, upon executing program code, initiates operations to render a graphical representation of an IC. In yet another aspect, the inventive arrangements may be implemented as a non-transitory computer-readable storage medium storing program code that, when executed, causes a processor and/or a system to render a graphical representation of an IC.

Further details relating to the example embodiments described within this disclosure are provided below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example data processing system (system) 100. As pictured, system 100 includes at least one processor 105 coupled to memory elements 110 through a system bus 115 or other suitable circuitry such as an input/output (I/O) subsystem. System 100 stores computer readable instructions (also referred to as "program code") within memory elements 110. Memory elements 110 may be considered an example of computer readable storage media. Processor 105 executes the program code accessed from memory elements 110 via system bus 115.

Memory elements 110 include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from bulk storage device 125 during execution.

System 100 may be coupled to one or more I/O devices such as a keyboard 130, a display device 135, a pointing device 140, and/or one or more network adapters 145.

System 100 may include one or more additional I/O device(s) beyond the examples provided. The I/O devices described herein may be coupled to system 100 either directly or through intervening I/O controllers. In some cases, one or more of the I/O device(s) may be combined as in the case where a touch sensitive display device 135 (e.g., a touchscreen) is used. In that case, display device 135 may also implement keyboard 130 and/or pointing device 140.

Network adapter 145 is a communication circuit configured to establish wired and/or wireless communication links with other devices. The communication links may be established over a network or as peer-to-peer communication links. Accordingly, network adapter 145 enables system 100 to become coupled to other systems, computer systems, remote printers, and/or remote storage devices. Example network adapter(s) 145 may include, but are not limited to, modems, cable modems, Ethernet cards, bus adapters, connectors, and so forth. Network adapter 145 may be a wireless transceiver, whether a short and/or a long range wireless transceiver.

As pictured, memory elements 110 may store an operating system 150, one or more application(s) 155, a device model 160, and a graphics model 165. Application 155, for example, may be an electronic design automation (EDA) application. In one aspect, operating system 150 and application(s) 155, being implemented in the form of executable program code, are executed by system 100 and, more particularly, by processor 105, to perform the various operations described within this disclosure using device model 160 and/or graphics model 165. As such, operating system 150, application 155, device model 160, and graphics model 165 may be considered integrated parts of system 100. Operating system 150, application 155, and any data items used, generated, and/or operated upon by system 100 as described herein such as device model 160 and/or graphics model 165 are functional data structures that impart functionality when employed as part of system 100.

As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

System 100 is capable of processing a device model 160 and/or graphics model 165 stored in memory elements 110. Device model 160 may specify the various elements of an IC for rendering on display device 135. In one embodiment, device model 160 specifies the circuitry and/or architecture of an IC such as a programmable IC in an un-configured state, e.g., without configuration data for a circuit design loaded therein. In one example, the programmable IC represented by device model 160 is a field programmable gate array (FPGA). Device model 160 may specify circuitry and/or architecture for any of a variety of different types of ICs and, as such, is not limited to programmable ICs and/or FPGAs.

System 100 is capable of rendering a graphical representation of the IC on display device 135 based upon device model 160 and graphics model 165. Device model 160 stores or includes objects representing elements of an IC. While device model 160 includes objects representing numerous different elements of the IC, in one embodiment, device model 160 does not include any object or objects that correlate to, or represent, fly-over wires of the IC to be described herein in greater detail.

In one or more embodiments, graphics model 165 includes one or more objects that may be used by system 100 to graphically represent fly-over wires. The objects specifying the fly-over wires are stored in association with a particular tile considered to be an owning tile of the fly-over wire and/or a particular wire within the owning tile. In this regard, fly-over wires may be said to "belong to" the owning tile. System 100, using the various techniques described herein, is capable of storing device model 160 using less memory than other conventional techniques due, at least in part, to the exclusion of objects corresponding to fly-over wires therein and/or selected tiles. System 100 is further capable of rendering a graphical representation of the IC as specified by device model 160 with reduced runtime by utilizing graphics model 165 for rendering the fly-over wires.

System 100 may include fewer components than shown or additional components not illustrated in FIG. 1 depending upon the particular type of device that is implemented. In addition, the particular operating system and/or application(s) included may also vary according to device type as may the types of network adapter(s) included. Further, one or more of the illustrative components may be incorporated into, or otherwise form a portion of, another component. For example, a processor may include at least some memory.

For ease of illustration and purposes of discussion, reference throughout this disclosure to rendering a graphical illustration of an IC means rendering a portion of the IC or the entirety of the IC based upon the portion of the IC within a viewport of an application. The rendering generates a graphical representation of the IC based upon device model 160 and graphics model 165. As such, in discussing tiles, wires, and various other circuit elements, it should be appreciated that such elements are represented as data structures stored in memory. Examples of particular data structures are provided herein for purposes of illustration. Such data structures, however, are provided for purposes of example only and are not intended as limitations.

Figure 2:
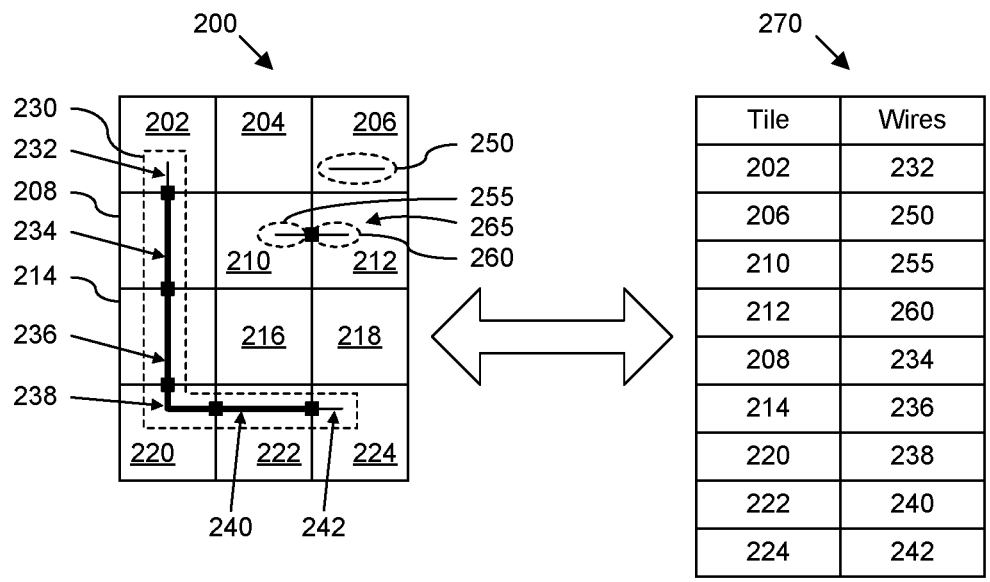
FIG. 2 illustrates an example of rendering fly-over wires using feed through wires.

FIG. 2 is an example representation of fly-over wires using feed through wires. FIG. 2 shows an example of a graphical representation 200 of an IC having a tiled architecture. In the example of FIG. 2, graphical representation 200 includes a plurality of tiles 202, 204, 206, 208, 210, 212, 214, 216, 218, 220, 222, and 224. As defined within this disclosure, the term "tile" means a circuit block. In one embodiment, a tile includes programmable circuitry. As an example, a tile may include one or more circuit elements such as logic circuitry, programmable logic circuitry, programmable interconnect points (PIPs), wires, and so forth. In another embodiment, a tile is a rectangular circuit block. A tile may also be a square circuit block.

Graphical representation 200 includes a node 230. As defined within this disclosure, the term "node" means a connection including one or more wires forming a continuous conductive line connecting a source and one or more loads. In reference to a graphical representation of an IC, e.g., graphical representation 200, the term "wire" means a portion of a node that exists entirely within a single tile. For example, a node may be formed of a single wire or two or more wires that, taken collectively, form a larger continuous conductive line. The wires represent metal wires in the IC.

In some cases, a node resides entirely within a tile. As an example, a node may connect a source located within the tile to a load located within the same tile. An example of a node residing entirely within a single tile is node 250. Other nodes may cross from one tile to another. For example, the node may connect a source located within a tile with a load located within an adjacent or abutting tile. An example of a node that connects wires in two adjacent or abutting tiles is node 265 formed of wires 255 and 260.

Still other nodes may have one or more feed through wires. As defined herein, the term "feed through wire" means a wire that passes (e.g., feeds) through a tile and has no interaction with the circuitry located in the particular tile through which the wire passes. For example, the node may connect a source located in a first tile to a load located in a second tile, where the first and second tiles are separated by one or more intervening tiles and/or space(s). The first and second tiles are not adjacent or abutting. In that case, the node has one or more feed through wires that pass over the intervening tiles and/or space(s) without interacting with any circuit elements within the intervening tiles. An example of a node that includes feed through wires is node 230.

Node 230 includes wires 232, 234, 236, 238, 240, and 242. As pictured, node 230 has endpoints in tiles 202 and 224. Node 230 passes over tiles 208, 214, 220, and 222. Wire 232 is located entirely in tile 202. Wire 234 is located entirely in tile 208. Wire 236 is located in tile 214. Wire 238 is located in tile 220. Wire 240 is located in tile 222. Wire 242 is located in tile 224. Wires 234, 236, 238, and 240 are shown with increased line width compared to wires 232 and 242. Wires 234, 236, 238, and 240 are considered "feed through" wires.

In the actual IC depicted by graphical representation 200, wires 232, 234, 236, 238, 240, and 240 may be a single continuous wire existing above the tiles shown, e.g., in a different layer. For purposes of the device model and generating graphical representation 200, node 230 is segmented into a plurality of feed through wires. The feed through wires are pushed down to the tile level within the device model despite the feed through wires not interacting with circuitry in the tiles over which each feed through wires passes.

For example, node 250 belongs to tile 206. Wire 255 of node 265 connecting tiles 210 and 212 belongs to tile 210. Wire 260 of node 265 belongs to tile 212. In the case of node 230, wire 232 belongs to tile 202; wire 234 belongs to tile 208; wire 236 belongs to tile 214, wire 238 belongs to tile 220, wire 240 belongs to tile 222, and wire 242 belongs to tile 224. Device model 270 is provided as a simplified example to illustrate how node 230 is broken up and allocated to the various tiles over which node 230 passes. Each of the wires of node 230 is stored as part of the tile over which that wire passes. In this regard, each wire exists within the device model, e.g., within or as part of a tile, as an object.

Accordingly, when rendering graphical representation 200 for the IC upon a display device, the system determines the tiles that are viewable, e.g., within the viewport. The data structures for the tiles within the viewport will include each of the wires within such tiles. When the tile is rendered within the viewport, the wires included within that tile are rendered as part of the tile. Thus, as tiles 202, 208, 214, 220, 222, and 224 are displayed, node 230 is rendered. Node 230 appears to be a continuous node despite the fact that node 230 is recalled as a plurality of individual wires (e.g., wires 232, 234, 236, 238, 240, and 242) within individual tiles (e.g., tiles 202, 208, 214, 220, 222, and 224, respectively).

Using the techniques illustrated in FIG. 2 consumes a significant amount of memory. For example, a modern programmable IC may include hundreds of thousands of tiles. Storing the particular wire with each tile requires a significant amount of memory thereby reducing runtime performance of the EDA tool. Further, many tiles are only included in the device model for the purpose of representing the individual feed through wires needed to represent fly-over wires. The inclusion of these tiles within the device model often consumes a significant amount of memory.

Figures 1, 3:
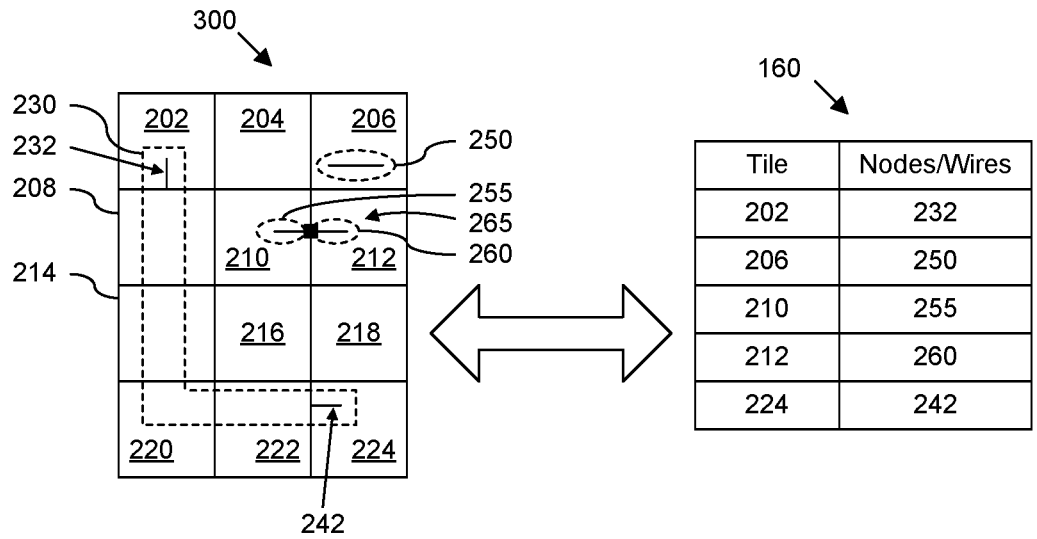
Figures 2, 3:
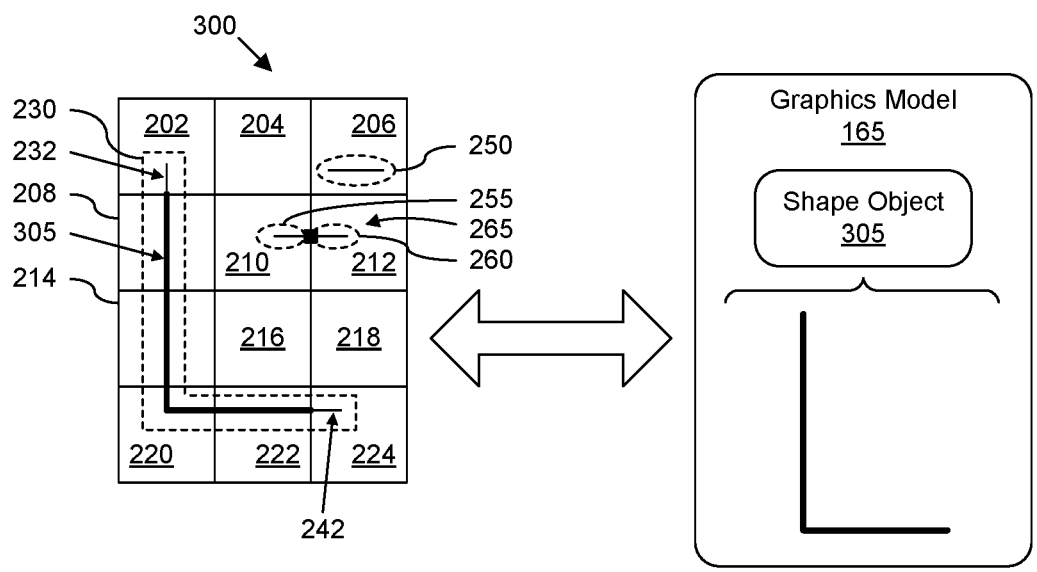

FIGS. 3-1 and 3-2, taken collectively, illustrate an example of rendering a fly-over wire using shapes. Unlike FIG. 2, the example of FIG. 3 utilizes device model 160 that does not specify feed through wires. While one or more wires connect tile 202 to tile 224 in the physical IC, device model 160 only specifies connectivity between wire 232 and wire 242 without specifying the particular wiring structure used to implement that connectivity. Accordingly, within device model 160, wires 234, 236, 238, and 240, which were pass through wires used to form a fly-over wire in FIG. 2, do not exist.

Graphical representation 300 of FIG. 3-1 illustrates a rendering of device model 160 where the feed through wires are absent. Other wires such as wires internal to tiles are still specified as objects within device model 160. For example, tile 202 owns or includes wire 232. Tile 224 includes wire 242. Tile 206 includes wire 250. Tile 210 includes wire 255. Tile 212 includes wire 260.

FIG. 3-2 illustrates an example rendering of a fly-over wire. For purposes of illustration, the owning tile of the fly-over wire of node 230 is tile 202. As defined herein, the term "fly-over wire" means the portion of a connection between a source and a load that passes over one or more intervening tiles and/or space(s) where the source and the load are not in adjacent or abutting tiles. Referring to FIG. 3-2, the fly-over wire of node 230 is the wire structure that connects wire 232 to wire 224. As discussed, while wires 232 and 224 are connected by a wire within the actual IC, device model 160 does not include any objects corresponding to the fly-over wire.

In one or more embodiments, the fly-over wire is rendered using graphics model 165. For example, the system may store one or more shapes, to be discussed in greater detail herein, as objects within graphics model 165. As pictured, graphics model 165 includes a shape object 305 that, when rendered, results in the graphical representation of the fly-over wire that connects wire 232 to wire 242. Shape object 305 may be stored in association with tile 202 or tile 224. For example, graphics model 165 may store information indicating that shape object 305 connects or abuts wire 232 and/or wire 242. Other tiles, as represented within device model 160, which include wires entirely therein are largely unchanged. For example, since wire 242 is located within tile 224 and is not a feed through wire, tile 224 still owns wire 242. Accordingly, the object for tile 224 within device model 160 specifies wire 242. Tile 206 still owns wire 250. Tile 210 still owns wire 255. Tile 212 still owns wire 260. As defined herein, an abutting wire is a wire located entirely within the source tile (load tile) that connects to a wire located entirely within a load tile (source tile) where the source and load tiles are abutting or adjacent. Wires 255 and 260 are examples of abutting wires.

In some cases, a node is a unidirectional node that is capable of carrying a signal in one direction. In one example, the convention is that the source tile is the owning tile of the fly-over wire of the node. For example, if node 230 is unidirectional and is capable of carrying a signal from tile 202 to tile 224, then tile 202 is considered the owning tile of the fly-over wire of node 230. In another example, the convention may be that the load tile, e.g., tile 224, owns the fly-over wire of node 230. In other cases, the node is bidirectional and is capable of carrying a signal in either direction. For example, if node 230 is bidirectional, node 230 may carry a signal from tile 202 to tile 224 or from tile 224 to tile 202 depending upon the circuit design and/or configuration data loaded into the IC. In the bidirectional case, one of tiles 202 or 224 is selected as the owning tile. The system may use a same convention in each case to maintain consistency of owning tiles.

Using the techniques illustrated in FIG. 3, the amount of memory required for storing the device model of the IC is reduced. For example, those tiles included in the device model for the sole purpose of representing feed through wires may be eliminated from the device model. Further, the performance of the system, e.g., runtime performance, is increased. In addition, having a complete graphical shape stored in association with an owning tile allows the graphical model to be used to draw wires over gaps or empty space also referred to herein as a null tile or null tiles.

Figure 4:
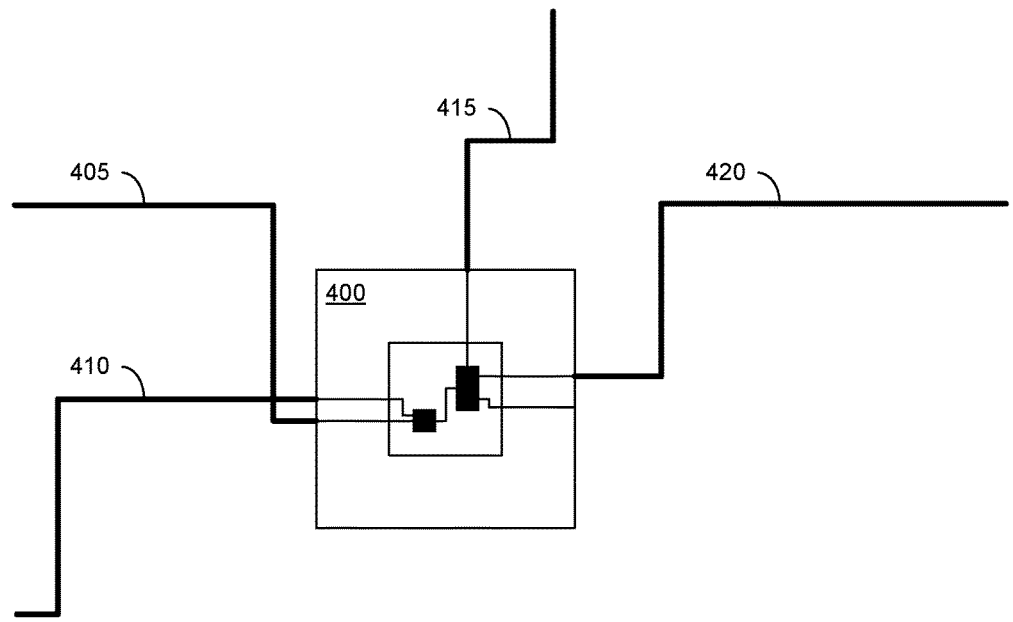
FIG. 4 is an example of fly-over wires and an owning tile.

FIG. 4 is an example of fly-over wires and the owning tile 400. In the example of FIG. 4, tile 400 owns fly-over wires 405, 410, 415, and 420. The portion of each node that is within tile 400 is owned by tile 400. Thus, rather than segmenting the fly-over wires into feed through wires that are allocated to the particular tile(s) over which each feed through wire passes, the graphical shape for the fly-over wires are owned entirely by one tile. In one embodiment, each fly-over wire 405, 410, 415, and 420 may not be represented or stored as a wire object in the device model. Rather, each of fly-over wires 405, 410, 415, and 420 may be implemented purely as a shape that is associated with the owning tile. The shape may be stored as part of the graphics model.

Use of an owning tile for fly-over wires results in distributed ownership of the fly-over wires among tiles of the IC. In modern IC architectures, the use of owning tiles for fly-over wires results in such tiles owning hundreds of fly-over wires. Other techniques such as introducing hierarchy into the device model and/or graphics model results in higher levels of that hierarchy owning a significantly larger number of wires which adds complexity and negatively impacts system performance.

Figure 5:
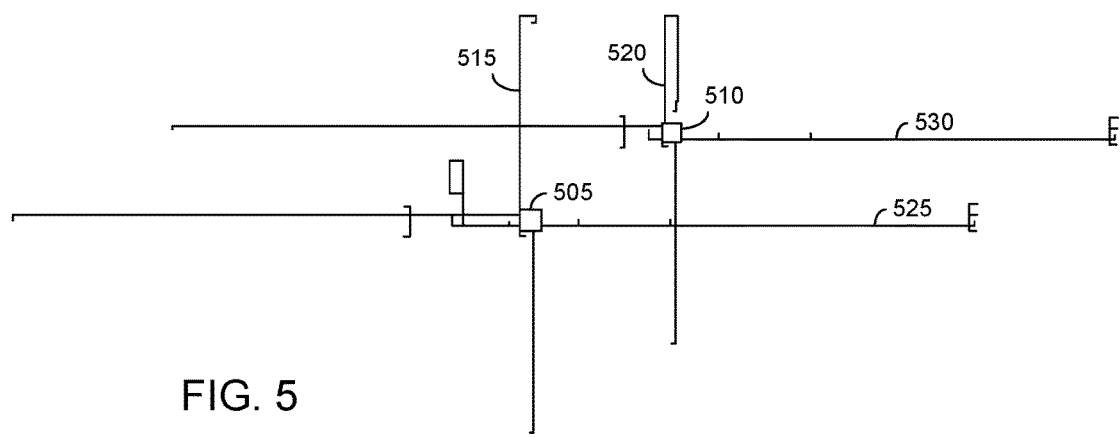
FIG. 5 is an example of two owning tiles and the fly-over wires owned by each respective tile.

FIG. 5 is an example of owning tiles 505 and 510 and the fly-over wires owned by each respective tile. In the example of FIG. 5, tiles 505 and 510 are of the same type. For example, tiles 505 and 510 each may be an instance of a configurable logic block (CLB), a block random access memory (BRAM), a digital signal processing block, etc. Other example tile types include, but are not limited to, input/output blocks (IOBs), multipliers, processors, clock managers, delay lock loops, and so forth.

FIG. 5 shows that despite tiles 505 and 510 being of a same type, the fly-over wires owned by each respective tile may differ. For example, fly-over wire 515, which is owned by tile 505, exits the top of tile 505. Fly-over wire 520, which is owned by tile 510, exits the top of tile 510. Fly-over wire 515 has a different shape than fly-over wire 520. In other cases, fly-over wires may have same shapes. For example, fly-over wire 525, which is owned by tile 505, has a same shape as fly-over wire 530, which is owned by tile 510.

In one embodiment, fly-over wires may be modeled or represented as a shape. By determining fly-over wires of same shape that are owned by tiles of a same type, fly-over wires and the owning tiles can be represented as a graphical tile pattern. In the examples described herein, the graphical tile pattern accounts for variations in shape of fly-over wires owned by the tiles for a given tile type. Accordingly, in one or more embodiments, the graphical tile pattern does not account for any end point wires. As defined herein, an end point wire is a wire located entirely within the source tile and/or the load tile that connects to a fly-over wire. For example, the end point wires are those portions of a node that are not considered part of the fly-over wire.

For example, referring again to FIG. 4, a graphical tile pattern may represent fly-over wires 405, 410, 415, and 420 for the type of tile 400, but not represent wires or account for variation in the wires within tile 400 that connect to fly-over wires 405, 410, 415, and 420. Referring to FIG. 2, for instance, wires 232 and 242 are end point wires for the fly-over wire of node 230. By excluding the end point wires from the graphical tile patterns, the size of the graphical tile patterns is reduced. The end point wires are still represented as part of the tiles within the device model.

In one or more other embodiments, the graphical tile pattern is implemented to include end point wires. For example, the shapes used to represent fly-over wires may be defined to include the end point wires within the source and/or load tile(s). In that case, the fly-over wire includes the entire node.

FIG. 6 illustrates example graphical tile patterns for instances of a particular type of tile. The graphical tile patterns of FIG. 6 map shapes of fly-over wires with wire identifiers (IDs). The shapes are represented using shape IDs. Each shape ID, for example, may be used to lookup the details of the shape of the fly-over wire for rendering. Example details for rendering shapes are described in connection with Table 1 and FIG. 13 herein.

In the example of FIG. 6, tiles A, B, C, D, and E are different instances of the same type of tile. The wires of tiles of a same type that may be used to connect to fly-over wires, e.g., end point wires, are the same and may be indexed using wire IDs. A fly-over wire connected to the wire indicated by wire ID 0, for example, connects in the same location of each tile of the same type. Thus, each of tiles A, B, C, D, and E has a wire corresponding to wire IDs of 0-6 that may connect to fly-over wires in same respective locations of the tiles.

For example, referring to tile A, the wire indicated by wire ID 0 is not connected to a fly-over wire. The wire indicated by wire ID 0 in tile A may be an internal wire, a wire that connects to an adjacent tile, etc. Accordingly, the shape associated with wire ID 0 is an "x" or null. The wire indicated by wire ID 2, however, does connect to a fly-over wire as shown by the numerical value of 34 for the shape ID. The shape ID 34 indicates a particular shape of fly-over wire. The different shapes of fly-over wires may be compared and/or analyzed so that identically shaped fly-over wires are assigned a same shape ID.

A review of the graphical tile pattern for each of tiles A, B, C, D, and E reveals that some tiles have same fly-over wire shapes for same wire IDs. For example, the graphical tile pattern for tile A exactly matches the graphical tile pattern of tile D. The graphical tile pattern of tile B exactly matches the graphical tile pattern of tile E. In one embodiment, the system is capable of removing duplicate graphical tile patterns to determine a set of graphical tile patterns for each type of tile. In another embodiment, the set of graphical tile patterns determined for each type of tile is the smallest set of graphical tile patterns possible.

FIG. 7 illustrates an example set of unique graphical tile patterns for a particular type of tile. For example, the system is capable of removing the graphical tile patterns corresponding to tiles D and E being duplicates, leaving graphical tile patterns for tiles A, B, and C. In FIG. 7, the graphical tile patterns for tiles A, B, and C are renamed graphical tile pattern (GTP) 0, GTP 1, and GTP 2, respectively. In this example, the values of 0, 1, and 2 are graphical tile pattern identifiers (IDs).

In one embodiment, the system is capable of assigning each tile instance of an IC a graphical tile pattern, presuming such tile instance has one or more fly-over wires. For example, the system is capable of assigning the graphical tile pattern ID for the graphical tile pattern to each of tiles A, B, C, D, and E. The system is capable of assigning graphical tile pattern ID 0 to tiles A and D. The system is capable of assigning graphical tile pattern ID 1 to tiles B and E. The system is further capable of assigning graphical tile pattern ID 2 to tile C.

FIGS. 8 and 9, taken collectively, illustrate an example of compressing the graphical tile patterns. FIG. 8 illustrates the creation of an index to wire ID array (array) 800. The system is capable of determining the set of wire ID to shape ID mappings for each of the graphical tile patterns of the set shown in FIG. 7 that do not contain a null shape. In the example of FIG. 8, the system determines that the wire IDs of 2, 3, and 5 have non-null shape IDs. Accordingly, the system is capable of generating array 800 that uses an index value starting at 0 and associates each index value with a wire ID having non-null shape ID. As shown, wire IDs 2, 3, and 5 are associated with new indexes of 0, 1, and 2, respectively. The system is capable of generating an index to wire ID array for each type of tile. Thus, each type of tile has one index to wire ID array that may be used to decompress or decode compressed graphical tile patterns.

FIG. 9 illustrates example compressed graphical tile patterns generated using array 800 of FIG. 8. As shown, the system has compressed each of graphical tile patterns 0, 1, and 2 by removing those rows with null shape IDs. It should be appreciated that the Index column of the graphical tile patterns and/or of array 800 need not be stored since the index may be determined based on the number of items in the data structure and order of such items. In any case, the system is able to later decode or decompress the compressed graphical tile patterns using array 800.

In one or more embodiments, graphical tile patterns, the unique set of graphical tile patterns, the graphical tile patterns and/or unique set of graphical tile patterns in compressed form, and/or array 800 may be stored as objects within the graphics model.

Figure 10:
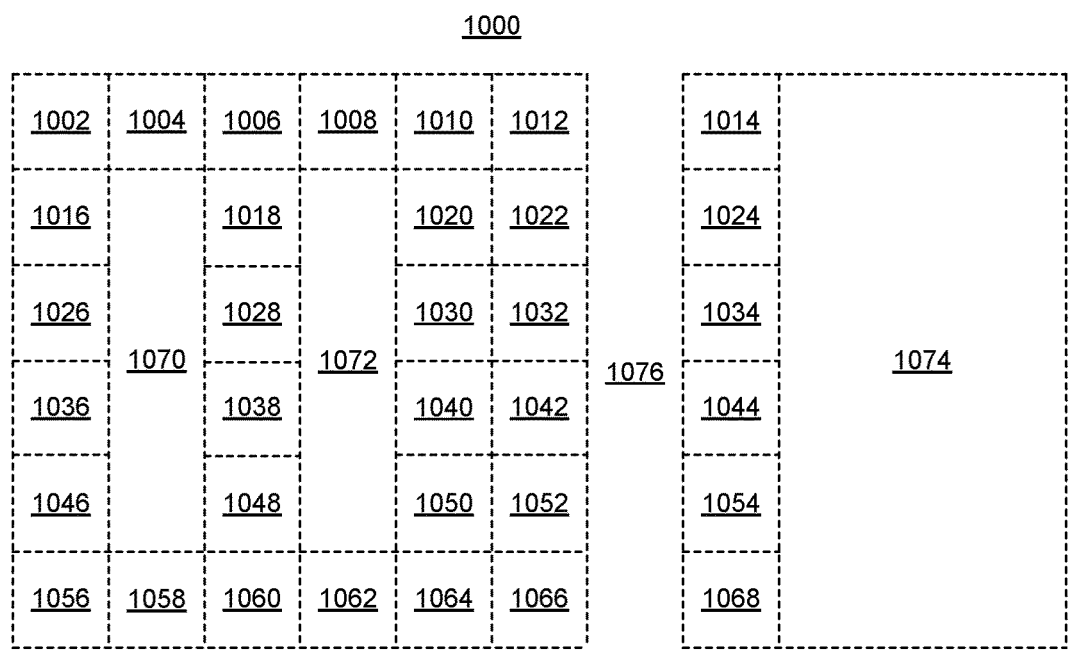
FIG. 10 is an example device model layout for an IC.

FIG. 10 is an example device model layout (layout) 1000 for an IC. As pictured, layout 1000 is organized as a grid, where each rectangle represents a tile. In the example of FIG. 10, the tiles are not uniform in shape. For example, tiles 1002-1068 are the same shape and are square. Tiles 1070 and 1072 are the same shape and are rectangular. Tile 1074 is rectangular and larger than the other tiles. Layout 1000, unlike other layouts for ICs and, in particular, programmable ICs, includes a null tile 1076. The column of tiles with tile 1012 at the top is separated from the column of tiles with tile 1014 at the top by null tile 1076.

As defined within this disclosure, the term "null tile" means an object representing a tile in the device model that does not include any circuit elements or other structures. The region of the actual IC corresponding to a null tile may have wires and possibly other structures passing over the tile or within the tile that are not represented within the device model. For example, a null tile may have a fly-over wire passing over.

FIG. 10 is provided for purposes of illustration. The arrangement of tiles, size of tiles, number of tiles, etc. are not intended as limitations, but rather to illustrate various aspects of the example embodiments described herein.

Figure 11:
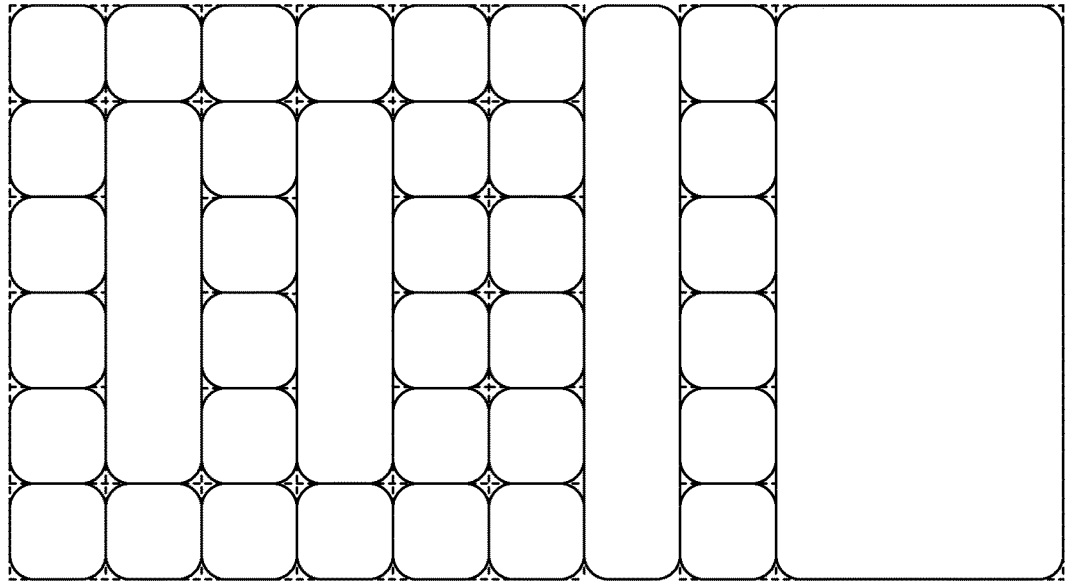
FIG. 11 illustrates the layout of FIG. 10 with an overlay.

FIG. 11 illustrates layout 1000 of FIG. 10 with an overlay. The overlay is formed of individual tile overlays, where each tile has a tile overlay that generally covers the area of the tile. In one embodiment, each tile overlay is implemented or stored as an object, data structure, or as part of a data structure in memory. Each tile overlay is sized to cover the underlying tile. Each tile, whether null or not, has a corresponding tile overlay sized to correspond to, or to coincide with, the underlying tile. In other words, each tile overlay is sized the same as the tile covered by that tile overlay. In another embodiment, the tile overlays may have a standardized unit size so that each tile overlay is the same size. In that case, an oversized tile such as tile 1070 is covered by a plurality of tile overlays of unit size. Further, null tile 1076 of FIG. 10 is covered by a tile overlay. In any case, each tile overlay may be implemented as an object or data structure of the graphics model and is capable of specifying the particular owning tiles that have fly-over wires passing over or through that tile overlay.

Figure 12:
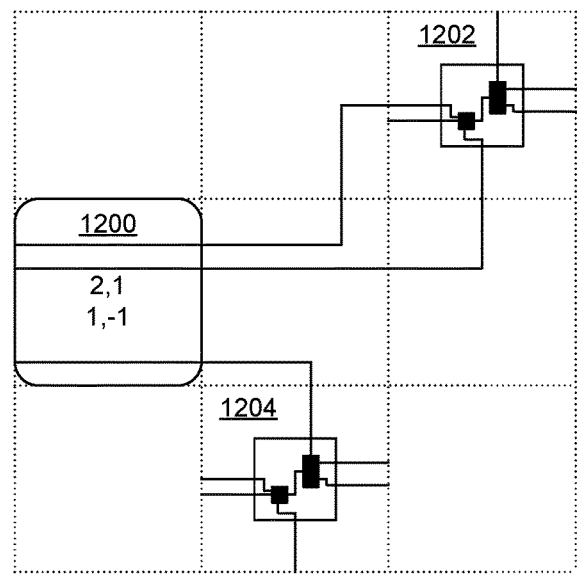
FIG. 12 illustrates an example of a tile overlay.

FIG. 12 illustrates an example of a tile overlay 1200. Tile overlay 1200 may be stored in memory as a data structure. For example, tile overlay 1200 may be stored as a tile overlay object within the graphics model. In the example of FIG. 12, tile overlay 1200 includes coordinates indicating two locations. Each coordinate pair specifies a location of an owning tile that has one or more fly-over wires extending through tile overlay 1200. The coordinate pair(s) specified by each tile overlay utilize the tile overlay itself as the origin or the (0, 0) point of reference using an (x, y) coordinate system.

Referring to tile overlay 1200, the coordinate pair (2, 1) specifies the location of owning tile 1202. Owning tile 1202 owns one or more fly-over wires extending through tile overlay 1200. For purposes of discussion, a fly-over wire that extends over or through a tile overlay also passes over or through the particular tile covered by the tile overlay. Thus, owning tile 1202 owns one or more fly-over wires that extend through the tile covered by tile overlay 1200. Coordinate pair (2, 1) indicates that tile 1202 is located two tiles to the right of tile overlay 1200 and one tile up from tile overlay 1200. The coordinate pair (1, −1) specifies the location of owning tile 1204. Owning tile 1204 owns one or more fly-over wires extending through tile overlay 1200. Coordinate pair (1, −1) indicates that tile 1204 is located one tile to the right of tile overlay 1200 and one tile down from tile overlay 1200.

Figure 13:
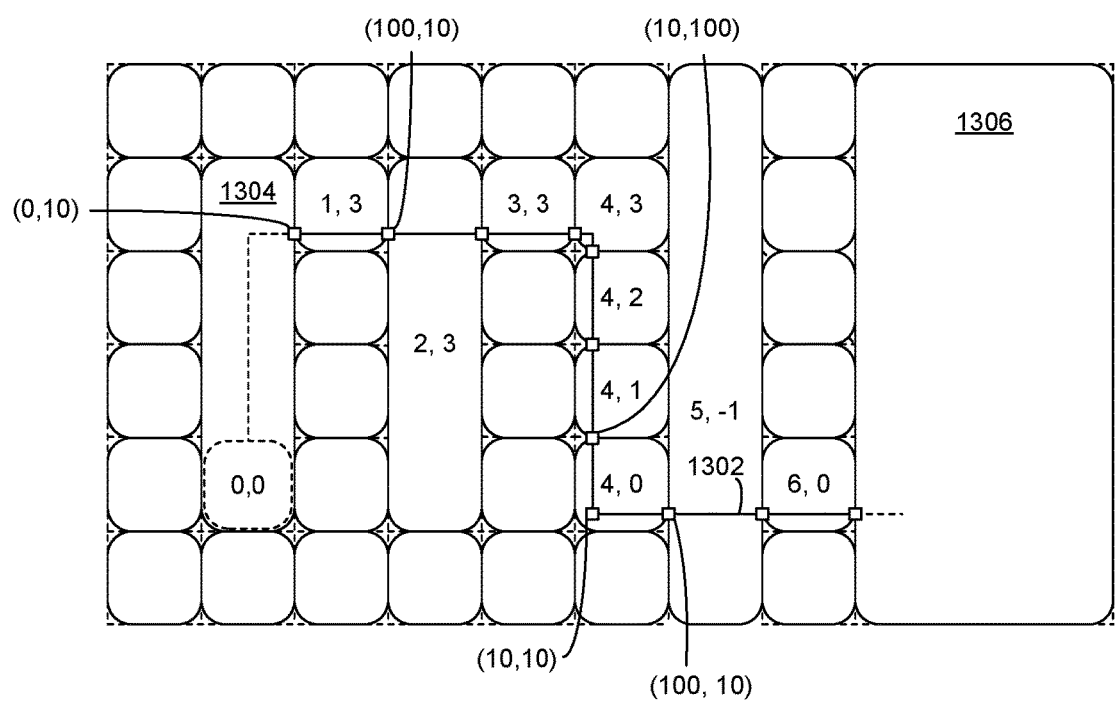
FIG. 13 illustrates an example of a fly-over wire for the layout of FIG. 10.

FIG. 13 illustrates an example of a fly-over wire 1302 for IC layout 1000. In FIG. 13, layout 1000 is covered by an overlay as illustrated in FIG. 12. In the example of FIG. 13, a fly-over wire 1302 is shown. Fly-over wire 1302 connects to an end point wire located in tile overlay 1304 (e.g., the tile covered by tile overlay 1304) and another end point wire located in tile overlay 1306. For purposes of illustration, the shape of fly-over wire 1302 may be specified using a sequence of tile overlay coordinates determined using the lower portion of tile overlay 1304 as the (0, 0) coordinate or origin as pictured. Coordinates of the tile overlays traversed by fly-over wire 1302 from tile overlay 1304 to tile overlay 1306 are shown on each tile overlay that is crossed.

Table 1 below illustrates the sequence of tile overlays traversed by fly-over wire 1302 starting from tile overlay 1304 to tile overlay 1306. Table 1 illustrates one embodiment where the shape of a fly-over wire is specified as a data structure using a sequence of one or more tile overlays given by coordinates using the owning tile as the reference point or origin. The left column or "Key" of Table 1 specifies the coordinate of the tile overlay through which a fly-over wire from the owning tile passes. As noted, the coordinate is measured using the owning tile as the origin.

The right column or "Values" specifies polyline points for the wire of the fly-over wire crossing the tile overlay of the same row. Polyline points indicate points within each respective tile overlay where a fly-over wire intersects an edge of the tile overlay and/or changes direction. A polyline element is a straight line that may be combined with other polyline elements for creating any shape that consists of straight lines such as a fly-over wire. Thus, as used herein, the term "polyline point" is a coordinate of an endpoint of a polyline element. A wire with a 90 degree turn is formed of two polyline elements. In one embodiment, Table 1 represents an example of a data structure that may be used to specify a shape of a fly-over wire. The shapes may be assigned shape IDs.

TABLE 1

| Key (Tile Overlay) | Values (Polyline Points relative to Tile Overlay) |
|---|---|
| 1, 3 | 0, 10 |
|  | 100, 10 |
| 2, 3 | 0, 10 |
|  | 100, 10 |
| 3, 3 | 0, 10 |
|  | 100, 10 |
| 4, 3 | 0, 10 |
|  | 10, 10 |
|  | 10, 0 |
| 4, 2 | 10, 100 |
|  | 10, 0 |
| 4, 1 | 10, 100 |
|  | 10, 0 |
| 4, 0 | 10, 100 |
|  | 10, 10 |
|  | 100, 10 |
| 5, −1 (tile overlay for null tile—lowest edge of tile overlay is used as y-coordinate) | 0, 10 |
|  | 100, 10 |
| 6, 0 | 0, 10 |
|  | 100, 10 |

Referring to Table 1 and to FIG. 13, for example, the polyline points for the tile overlay with coordinates of (1, 3) are (0, 10) and (100, 10). Within FIG. 13, small blocks are placed on tile overlays to indicate those locations for which polyline points are specified in Table 1. By superimposing a grid atop each of the tile overlays and using (x, y) coordinates of (0, 0) for the lower left hand corner and (x, y) coordinates of (100, 100) for the upper right hand corner, the path or route of a fly-over wire within a tile overlay may be specified with polyline points. The coordinates (0, 10) indicate that the fly-over wire crosses the left edge boundary of tile overlay (1, 3) at an x-coordinate of 0 (out of 100) and a y-coordinate of 10 (out of 100). The coordinates (100, 10) indicate that the fly-over wire crosses the right edge boundary of tile overlay (1, 3) at an x-coordinate of 100 and a y-coordinate of 10.

Taking another example from Table 1 and FIG. 13, consider tile overlay (4, 0) which has three polyline coordinate pairs. The coordinates (10, 100) indicate that the fly-over wire crosses the top boundary of tile overlay (4, 0) at the location indicated in FIG. 13. The coordinates (10, 10) indicate that the fly-over wire continues from coordinates (10, 100) down to coordinates (10, 10) as indicated in FIG. 13. The coordinates of (100, 10) indicate that the fly-over wire continues from the coordinate of (10, 10) to the right edge boundary of tile overlay (4, 0) to coordinates (100, 10) as shown in FIG. 13.

The example of Table 1 and FIG. 13 illustrate an example embodiment where the tile overlays are sized the same as the tiles covered by each respective tile overlay. As noted, in one or more other embodiments, the tile overlays are unit sized. It should be appreciated that the polyline points may be used in the case where tile overlays are unit sized. In some cases, therefore, additional tile overlays would be used to cover large sized tiles.

It should be appreciated that polyline points are one example of a computing mechanism that may be used to specify the shape of a fly-over wire. Other computing mechanisms may be used. In this regard, the use of polyline points is not intended as a limitation of the example embodiments described herein. Moreover, a shape need not be defined as one or more segments as is the case with polyline points. In another example embodiment, shapes of fly-over wires may be specified as any of a variety of known image files. The image file may be displayed and scaled according to the viewport. In another example embodiment, a fly-over wire shape is specified as a vector of points. Any of a variety of computing mechanisms for representing shapes may be used to specify fly-over wire shapes so long as such mechanisms are correlated with shape IDs for reference and/or inclusion in the data structures discussed herein.

Figure 14:
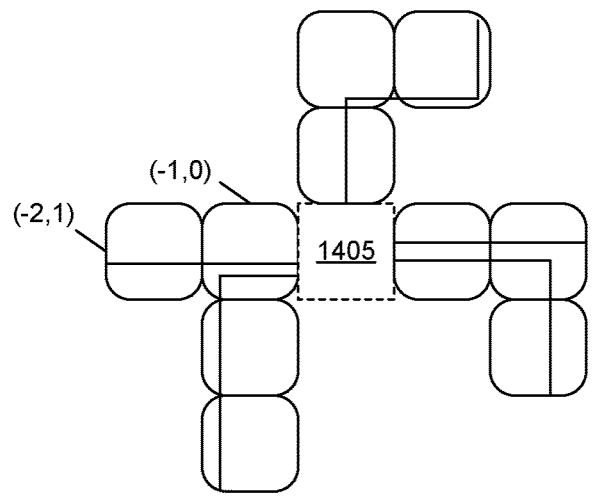
FIG. 14 illustrates an example of an owning tile and the fly-over wires owned by the tile.

FIG. 14 illustrates an example of an owning tile 1405 and the fly-over wires owned by tile 1405. In one embodiment, FIG. 14 illustrates a fly-over wire pattern for owning tile 1405. The fly-over wire pattern specifies the particular tiles, or tile overlays, that fly-over wires of an owning tile traverse. Table 2 is an example data structure specifying the fly-over wire pattern of FIG. 14. The Key column includes coordinates for each tile overlay through which a portion of a fly-over wire of tile 1405 passes. The Value column specifies the shape of the fly-over wire or fly-over wires within each tile overlay. For example, the tile overlay located (−2, 1) from tile 1405 includes a fly-over wire having a shape ID of 1. The tile overlay located (−1, 0) from tile 1405 includes two fly-over wires having shape IDs of 1 and 2. As noted, particular shapes given by the Value or shape ID may be specified using the data structure illustrated in Table 1 or another suitable alternative for specifying shape.

TABLE 2

| Key (Tile Overlay Offset from Owning Tile) | Value (Shape IDs) |
|---|---|
| −2, 0 | 1 |
| −1, 0 | 1, 2 |
| −1, −1 | 2 |
| −1, −2 | 2 |
| 0, 1 | 3 |
| 0, 2 | 3 |
| 1, 2 | 3 |
| 1, 0 | 4, 5 |
| 2, 0 | 4, 5 |
| 2, −1 | 5 |

Figure 15:
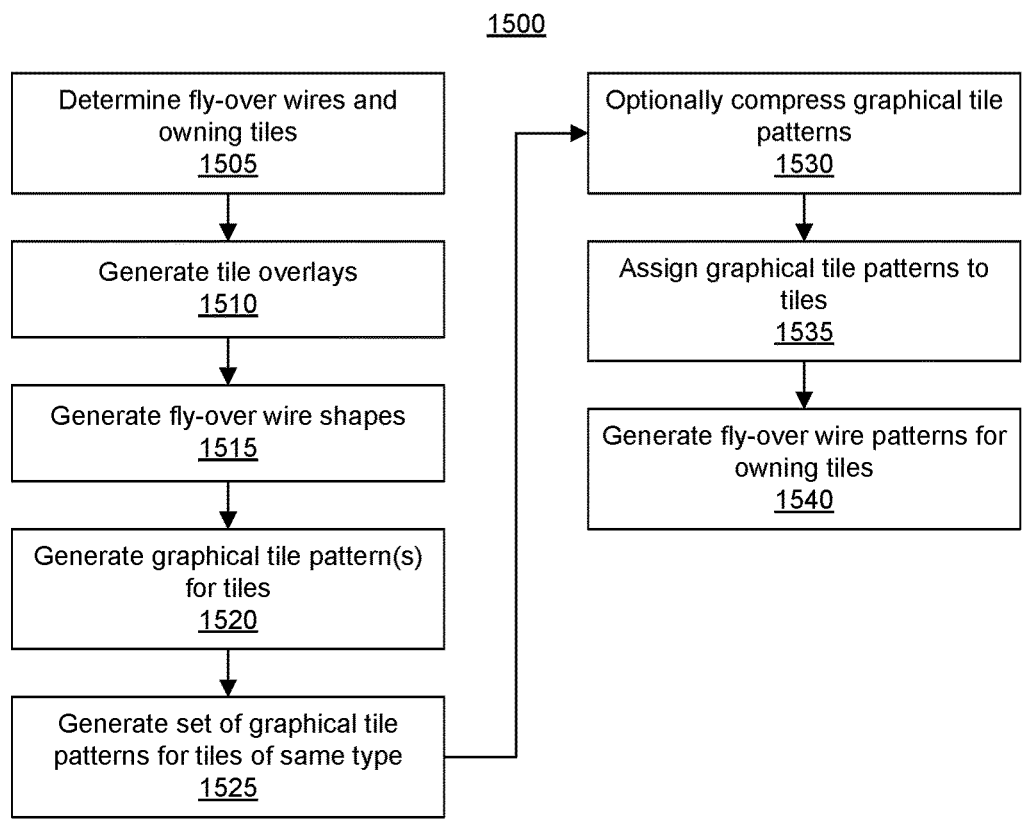
FIG. 15 is an example method of generating data structures to represent fly-over wires of an IC.

FIG. 15 is an example method 1500 of generating data structures to represent fly-over wires for an IC. Method 1500 may be performed by a system as described with reference to FIG. 1. In block 1505, the system determines fly-over wires and the owning tiles for the fly-over wires. The fly-over wires may be assigned to owning tiles based upon the location of the source of the fly-over wire, the location of the load of the fly-over wire, or by convention. In block 1510, the system generates tile overlays for the tiles of the layout of the IC. Each tile overlay for a tile specifies the coordinate pair of the owning tile having one or more fly-over wires extending through or passing over that tile overlay (and tile).

In block 1515, the system generates fly-over wire shapes. For example, the system is capable writing shapes of fly-over wires using coordinates of tile overlays through which the fly-over wires pass and polyline points of the tiles as illustrated in Table 1. In block 1520, the system generates graphical tile patterns for tiles of the IC. The system may generate graphical tile patterns for each of the different types of tiles of the IC. In generating the graphical tile patterns, the system maps fly-over wire shapes to wires of the tile. As noted, the wires of tiles of the same type have same wire IDs for same locations or exit points from the tile. As such, the system effectively maps shape IDs to wire IDs for the different instances of types of tiles of the IC. Example graphical tile patterns are shown and described with reference to FIG. 6.

In block 1525, the system determines the set of graphical tile patterns, e.g., the minimum set of graphical tile patterns, for each different type of tile of the IC. FIG. 7 illustrates an example of a minimum set of graphical tile patterns for a given type of tile of the IC as determined from the graphical tile patterns of FIG. 6. In block 1530, the system optionally compresses the sets of graphical tile patterns for the different types of tiles of the IC. An example of the compression that may be performed by the system is shown in FIGS. 8 and 9.

In block 1535, the system assigns graphical tile patterns to tiles of the IC. For example, the system is capable of assigning one graphical tile pattern to each of the owning tiles of the IC. In block 1540, the system generates fly-over wire patterns for tiles of the IC. For example, the system is capable of generating a fly-over wire pattern for each of the owning tiles of the IC. An example of a fly-over wire pattern is shown in Table 2 of this disclosure.

Figure 16:
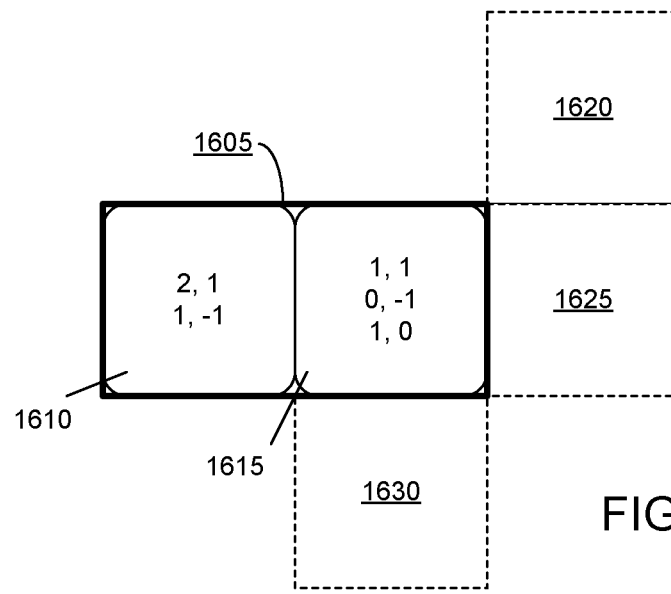
FIGS. 16 and 17, taken collectively, illustrate an example of determining which fly-over wires are visible within a given viewport and drawing those fly-over wire(s).
Figure 17:
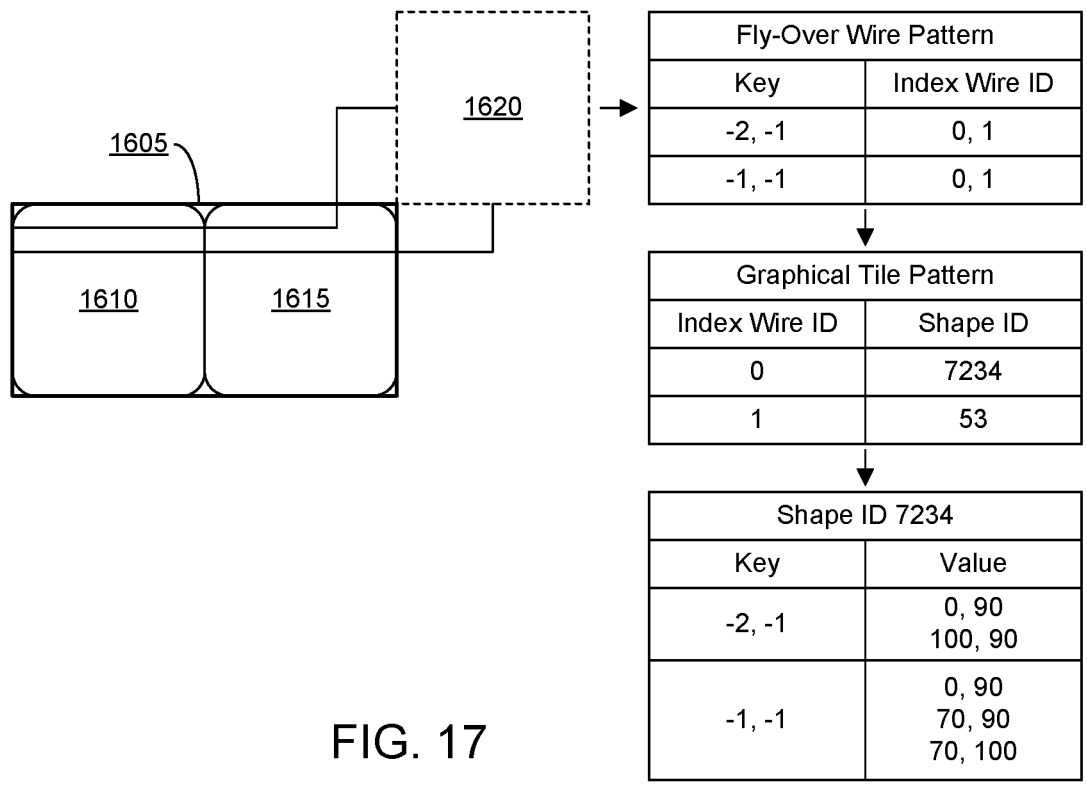

FIGS. 16 and 17, taken collectively, illustrate an example of determining which fly-over wires are visible within a given viewport and drawing the fly-over wire(s). In the example of FIG. 16, viewport 1605 includes two tiles. For purposes of discussion, reference numbers 1610 and 1615 will be used to refer to both the tile overlays and the tiles beneath the respective tile overlays. Thus, viewport 1605 includes tiles 1610 and 1615.

As discussed, the coordinates within tile overlays indicate the location of the owning tile that has fly-over wires that pass through each respective tile overlay. Referring to tile overlay 1610, the coordinates of (2, 1) indicate owning tile 1620. The coordinates of (1, −1) indicate owning tile 1630. Tile overlay 1610 indicates that two owning tiles have fly-over wires that need to be displayed to properly render tile 1610. Tile overlay 1615 indicates that three owning tiles have fly-over wires that need to be displayed to properly render tile 1615. Referring to tile overlay 1615, the coordinates of (1, 1) indicate owning tile 1620. The coordinates of (0, −1) indicate owning tile 1630. The coordinates of (1, 0) indicate owning tile 1625.

In FIG. 17, having determined the tiles within viewport 1605 and the owning tiles with fly-over wires within viewport 1605, the system begins to determine fly-over wires to be rendered within viewport 1605. In the example of FIG. 17, the system determines the fly-over wire pattern (e.g., a data structure) for owning tile 1620. As discussed, the fly-over wire pattern may have a data structure organized as illustrated in Table 2. The system is capable of locating the entries in the fly-over wire pattern that correspond to tile overlays 1610 and 1615. In this example, the entries have keys that are the inverse of the location of tile 1620. For example, tile overlay 1610 has coordinates of (2, 1) for tile 1620. The key within the fly-over wire pattern for tile 1620 is (−2, −1). The key (−2, −1) from the fly-over wire pattern, when used as a coordinate, effectively points back to tile 1610. The value for key (−2, −1) is 0, 1 indicating that wire IDs 0 and 1 of tile 1620 have fly-over wire shapes that participate in tile overlay 1610 and hence in viewport 1605.

The system is further capable of retrieving the graphical tile pattern for tile 1620. The index wire ID identifies a wire shape within each graphical tile pattern. Having obtained the graphical tile pattern for the instance of tile 1620, the system determines that shape ID 7234 corresponds to index wire ID 0 and shape ID 53 corresponds to index wire ID 1. The system is further capable of retrieving the shape using the shape ID from the graphical tile pattern. For purposes of discussion, the shape is retrieved using shape ID 7234. The system locates the coordinates of (−2, −1) and (−1, −1) within the shape (e.g., the shape data structure shown) to obtain the polyline points for each of tile overlays 1610 and 1615. Using the polyline points, the system is capable of displaying the one fly-over wire within viewport 1605 that is owned by tile 1620. The system may repeat the last operations of locating the shape data structure for shape ID 53, obtaining the polyline points, and drawing (e.g., displaying) the second fly-over wire from tile 1620 within viewport 1605 using the retrieved polyline points for shape ID 53.

The system is capable of repeating the process described with reference to FIGS. 16 and 17 for owning tiles 1625 and 1630 to complete rendering of the fly-over wires within viewport 1605. The system, having determined and drawn the fly-over wires for each of owning tiles 1620, 1625, and 1630 has drawn all of the fly-over wires to be displayed within viewport 1605.

Figure 18:
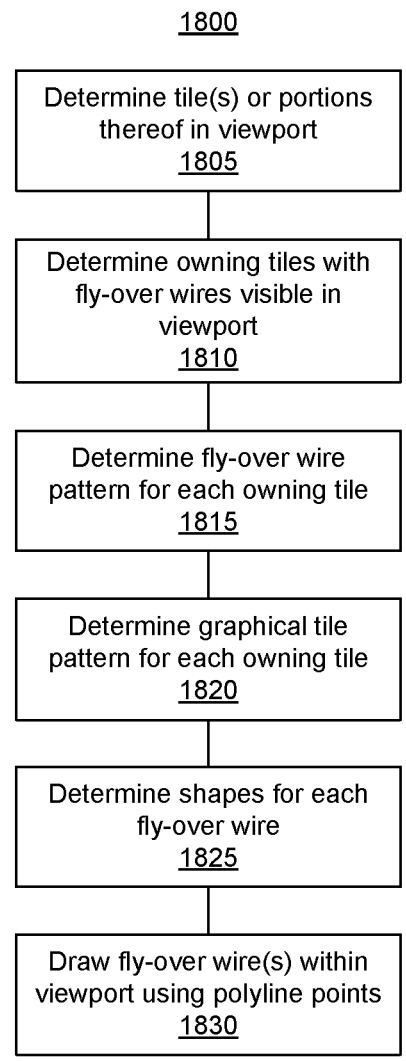
FIG. 18 is an example method of rendering fly-over wires within a viewport.

FIG. 18 is an example method 1800 of rendering fly-over wires within a viewport. Method 1800 can be performed by a system such as the system described in connection with FIG. 1. For example, a user may be viewing a graphical model of an IC. The user may choose the IC to be viewed graphically or a portion of the IC, which is included in the viewport.

In block 1805, the system determines the tile or tiles (or portions thereof) that are to be rendered within the viewport. In block 1810, the system determines the owning tiles within fly-over wires that are visible (e.g., extend into the tiles) within the viewport. For example, the system is capable of reading the coordinates specified within the tile overlay objects for each tile within the viewport. As discussed, the tile overlay of each tile indicates the owning tiles that have fly-over wires extending over that tile (or tile overlay as the case may be).

In block 1815, the system determines the fly-over wire pattern for each of the owning tiles determined in block 1810. The fly-over wire pattern of each tile specifies the coordinates of tiles, from the point of view of the owning tile, over which a fly-over wire of the owning tile passes. Within each fly-over wire pattern identified, the system locates the key that matches the tiles within the viewport. As described with reference to FIG. 17, the key that matches the tiles within the viewport will have coordinates with opposite signs. For example, if the tile overlay of a tile within the viewport indicates an owning tile located at (2, 1), the matching coordinates within the fly-over wire pattern for the owning tile corresponding to the tile overlay in the viewport are (−2, −1).

In block 1820, the system determines the graphical tile pattern for each owning tile determined in block 1810. In one or more embodiments, the graphical tile pattern of the owning tile(s) may be compressed. Accordingly, the system is capable of locating the index to wire ID array for each owning tile. As noted, the index to wire ID array for a tile is determined from the type of the owning tile and location within the grid. The system is capable of determining the type of each owning tile and retrieving the index to wire ID array for each tile type. The system may then decompress the retrieved graphical tile pattern for each owning tile.

In block 1825, the system determines shapes for the fly-over wires. The system is capable of determining the shape for each fly-over wire of the owning tiles determined in block 1810. From the graphical tile pattern for each owning tile, the system determines the shape ID for each index wire ID. In block 1830, for each fly-over wire for which a shape is determined in block 1825, the system determines the polyline points for the fly-over wire. The system draws the fly-over wires within the viewport over the tiles in accordance with the polyline points.

The process described with reference to FIG. 18 may also be applied in other contexts. For example, in some cases, a fly-over wire that is displayed within a viewport is selected by a user input. The fly-over wire may be selected using a pointing device or other input device. In response to the user input selecting the fly-over wire, the system is capable of determining the location (e.g., coordinate) of the user input within the viewport. The system is capable of determining the tile overlay of the tile including the location. The system is then capable of using the operations described with reference to FIGS. 17 and 18 to determine the fly-over wires that pass above the tile encompassing the location of the user selection. With the polyline points for the fly-over wires determined, the system further is capable of determining which of the fly-over wires intersects the location specified by the user input. The fly-over wire that intersects the location specified by the user input is the fly-over wire selected by the user. The system may draw or highlight the selected fly-over wire within the viewport to visually distinguish the selected fly-over wire from other non-selected objects such as other fly-over wires.

The example embodiments described within this disclosure significantly reduce the burden of modeling large numbers of feed through wires in many tiles. Reducing the number of feed through wires in tiles reduces complexity and memory consumption thereby facilitating faster runtimes. Further, the device model more closely tracks the register transfer level (RTL) description of the tiles thereby enhancing the ability to automatically generate a device model from the RTL source.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "connected" means coupled, whether directly without any intervening elements or indirectly with one or more intervening elements, unless otherwise indicated. Two elements may be coupled or connected mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments include a method of rendering a graphical representation of an IC. The method can include determining, using a processor, a tile of a device model at least partially within a viewport, determining, using the processor, an owning tile having a fly-over wire passing over the tile, determining, using the processor, a predetermined shape of the fly-over wire, and drawing, using the processor, the fly-over wire within the viewport based upon the shape.

Determining the tile located within the viewport can include reading a coordinate of the owning tile stored within a tile overlay for the tile.

Determining the predetermined shape of the fly-over wire can include determining polyline points defining a polyline element for the fly-over wire within the tile. Accordingly, drawing the fly-over wire can include drawing the fly-over wire within the tile based upon the polyline points.

Determining the predetermined shape of the fly-over wire can include determining a fly-over wire pattern for the owning tile, wherein the fly-over wire pattern specifies each tile overlay of a tile over which a fly-over wire of the owning tile passes and an index wire identifier of each fly-over wire.

The method can include determining the predetermined shape of the fly-over wire based upon a shape identifier associated with the index wire identifier of the fly-over wire.

The method can also include determining, from the shape identifier and coordinates of the owning tile from the tile overlay of the tile, placement of the fly-over wire within the tile.

In one aspect, the device model does not include an object representing the fly-over wire.

One or more embodiments include a system for rendering a graphical representation of an IC. The system includes a processor programmed to initiate executable operations. The executable operations can include determining a tile of a device model at least partially within a viewport, determining an owning tile having a fly-over wire passing over the tile, determining a predetermined shape of the fly-over wire, and drawing, on a display device, the fly-over wire within the viewport based upon the shape.

Determining the tile located within the viewport can include reading a coordinate of the owning tile stored within a tile overlay for the tile.

Determining the predetermined shape of the fly-over wire can include determining polyline points defining a polyline element for the fly-over wire within the tile. Accordingly, drawing the fly-over wire can include drawing the fly-over wire within the tile based upon the polyline points.

Determining the predetermined shape of the fly-over wire can include determining a fly-over wire pattern for the owning tile, wherein the fly-over wire pattern specifies each tile overlay of a tile over which a fly-over wire of the owning tile passes and an index wire identifier of each fly-over wire.

The processor can be configured to initiate executable operations further including determining the predetermined shape of the fly-over wire based upon a shape identifier associated with the index wire identifier of the fly-over wire.

The processor can be configured to initiate executable operations further including determining, from the shape identifier and coordinates of the owning tile from the tile overlay of the tile, placement of the fly-over wire within the tile.

In one aspect, the device model does not include an object representing the fly-over wire.

One or more embodiments include a computer program product. The computer program product includes a computer readable storage medium having program code stored thereon for rendering a graphical representation of an IC. The program code is executable by a processor to perform operations including determining a tile of a device model at least partially within a viewport, determining an owning tile having a fly-over wire passing over the tile, determining a predetermined shape of the fly-over wire, and drawing the fly-over wire within the viewport based upon the shape.

Determining the tile located within the viewport can include reading a coordinate of the owning tile stored within a tile overlay for the tile.

Determining the predetermined shape of the fly-over wire can include determining polyline points defining a polyline element for the fly-over wire within the tile. Accordingly, drawing the fly-over wire can include drawing the fly-over wire within the tile based upon the polyline points.

Determining the predetermined shape of the fly-over wire can include determining a fly-over wire pattern for the owning tile, wherein the fly-over wire pattern specifies each tile overlay of a tile over which a fly-over wire of the owning tile passes and an index wire identifier of each fly-over wire.

The program code can be executable by a processor to perform operations further including determining the predetermined shape of the fly-over wire based upon a shape identifier associated with the index wire identifier of the fly-over wire.

The program code can be executable by a processor to perform operations further including determining, from the shape identifier and coordinates of the owning tile from the tile overlay of the tile, placement of the fly-over wire within the tile.

In one aspect, the device model does not include an object representing the fly-over wire.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of rendering a graphical representation of an integrated circuit, the method comprising:
    determining, using a processor, a tile of a device model at least partially displayed within a viewport, wherein the viewport is a viewable area of content on a display screen;
    determining, using the processor, an owning tile having a fly-over wire passing over the tile;
    determining, using the processor, a predetermined shape of the fly-over wire by determining a fly-over wire pattern for the owning tile, wherein the fly-over wire pattern specifies each tile overlay of a tile over which a fly-over wire of the owning tile passes and an index wire identifier of each fly-over wire; and
    drawing, using the processor, the fly-over wire within the viewport based upon the shape so that the tile and the fly-over wire are displayed within the viewport on the display screen.

2. The method of claim 1, wherein the determining the tile located within the viewport comprises:
    reading a coordinate of the owning tile stored within a tile overlay for the tile.

3. The method of claim 1, wherein the determining the predetermined shape of the fly-over wire comprises:
    determining polyline points defining a polyline element for the fly-over wire within the tile;

wherein drawing the fly-over wire comprises drawing the fly-over wire within the tile based upon the polyline points.

4. The method of claim 1, further comprising:
determining the predetermined shape of the fly-over wire based upon a shape identifier associated with the index wire identifier of the fly-over wire.

5. The method of claim 4, further comprising:
determining, from the shape identifier and coordinates of the owning tile from the tile overlay of the tile, placement of the fly-over wire within the tile.

6. The method of claim 1, wherein the device model does not include an object representing the fly-over wire.

7. A system for rendering a graphical representation of an integrated circuit, the system comprising:
 a processor configured to initiate executable operations including:
 determining a tile of a device model at least partially displayed within a viewport, wherein the viewport is a viewable area of content on a display screen;
 determining an owning tile having a fly-over wire passing over the tile;
 determining a predetermined shape of the fly-over wire by determining a fly-over wire pattern for the owning tile, wherein the fly-over wire pattern specifies each tile overlay of a tile over which a fly-over wire of the owning tile passes and an index wire identifier of each fly-over wire; and
 drawing, on a display device, the fly-over wire within the viewport based upon the shape so that the tile and the fly-over wire are displayed within the viewport on the display screen.

8. The system of claim 7, wherein the determining the tile located within the viewport comprises:
reading a coordinate of the owning tile stored within a tile overlay for the tile.

9. The system of claim 7, wherein the determining the predetermined shape of the fly-over wire comprises:
determining polyline points defining a polyline element for the fly-over wire within the tile;
wherein drawing the fly-over wire comprises drawing the fly-over wire within the tile based upon the polyline points.

10. The system of claim 7, wherein the processor is configured to initiate executable operations further including:
determining the predetermined shape of the fly-over wire based upon a shape identifier associated with the index wire identifier of the fly-over wire.

11. The system of claim 10, wherein the processor is configured to initiate executable operations further including:
determining, from the shape identifier and coordinates of the owning tile from the tile overlay of the tile, placement of the fly-over wire within the tile.

12. The system of claim 7, wherein the device model does not include an object representing the fly-over wire.

13. A computer program product comprising a computer readable storage medium having program code stored thereon for rendering a graphical representation of an integrated circuit, the program code executable by a processor to perform operations comprising:
 determining a tile of a device model at least partially displayed within a viewport, wherein the viewport is a viewable area of content on a display screen;
 determining an owning tile having a fly-over wire passing over the tile;
 determining a predetermined shape of the fly-over wire by determining a fly-over wire pattern for the owning tile, wherein the fly-over wire pattern specifies each tile overlay of a tile over which a fly-over wire of the owning tile passes and an index wire identifier of each fly-over wire; and
 drawing the fly-over wire within the viewport based upon the shape so that the tile and the fly-over wire are displayed within the viewport on the display screen.

14. The computer program product of claim 13, wherein the determining the tile located within the viewport comprises:
reading a coordinate of the owning tile stored within a tile overlay for the tile.

15. The computer program product of claim 13, wherein the determining the predetermined shape of the fly-over wire comprises:
determining polyline points defining a polyline element for the fly-over wire within the tile;
wherein drawing the fly-over wire comprises drawing the fly-over wire within the tile based upon the polyline points.

16. The computer program product of claim 13, wherein the program code is executable by a processor to perform operations further comprising:
determining the predetermined shape of the fly-over wire based upon a shape identifier associated with the index wire identifier of the fly-over wire.

17. The computer program product of claim 16, wherein the program code is executable by a processor to perform operations further comprising:
determining, from the shape identifier and coordinates of the owning tile from the tile overlay of the tile, placement of the fly-over wire within the tile.

18. The computer program product of claim 13, wherein the device model does not include an object representing the fly-over wire.

* * * * *